(12) United States Patent
Sasaki

(10) Patent No.: US 10,491,083 B2
(45) Date of Patent: Nov. 26, 2019

(54) SEMICONDUCTOR DEVICE AND SEMICONDUCTOR DEVICE MOUNTING METHOD

(71) Applicant: SHINDENGEN ELECTRIC MANUFACTURING CO., LTD., Tokyo (JP)

(72) Inventor: Mitsumasa Sasaki, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 30 days.

(21) Appl. No.: 15/576,701

(22) PCT Filed: May 29, 2015

(86) PCT No.: PCT/JP2015/065584
§ 371 (c)(1),
(2) Date: Nov. 22, 2017

(87) PCT Pub. No.: WO2016/194048
PCT Pub. Date: Dec. 8, 2016

(65) Prior Publication Data
US 2018/0138788 A1   May 17, 2018

(51) Int. Cl.
*H02K 11/30* (2016.01)
*H01L 23/28* (2006.01)
(Continued)

(52) U.S. Cl.
CPC .............. *H02K 11/30* (2016.01); *H01L 23/04* (2013.01); *H01L 23/28* (2013.01);
(Continued)

(58) Field of Classification Search
CPC ... H01L 23/04; H01L 23/28; H01L 23/49541; H01L 25/07; H01L 25/115; H01L 25/118;
(Continued)

(56) References Cited

U.S. PATENT DOCUMENTS 4,259,603 A * 3/1981 Uchiyama ............ H02K 1/2786
310/156.21
5,737,210 A    4/1998 Barahia
(Continued)

FOREIGN PATENT DOCUMENTS

CN    102207269 A    10/2011
EP    1234761 A2    8/2002
(Continued)

OTHER PUBLICATIONS

Suzuki et al., English Machine Translation of JP59061090 (Year: 1982).*
(Continued)

*Primary Examiner* — Mang Tin Bik Lian
*Assistant Examiner* — Rashad H Johnson
(74) *Attorney, Agent, or Firm* — The Harris Firm

(57) ABSTRACT

A semiconductor device includes a device main body that is semi-annular, the device main body having an inner circumferential surface formed arcuate in plan view and an outer circumferential surface formed arcuate in plan view. Cutout portions are formed on a first end surface, on one end side, in a circumferential direction, of the device main body and a second end surface, on an other end side, in the circumferential direction, of the device main body. The cutout portions are used for inserting screws for fixing the device main body to a base portion.

8 Claims, 8 Drawing Sheets

(51) Int. Cl.
*H01L 25/07* (2006.01)
*H01L 25/18* (2006.01)
*H02K 11/00* (2016.01)
*H02K 5/22* (2006.01)
*H01L 23/04* (2006.01)
*H01L 23/495* (2006.01)
*H01L 25/11* (2006.01)
*H02K 11/04* (2016.01)
*H02M 7/00* (2006.01)
*H02K 11/33* (2016.01)
*H02K 11/38* (2016.01)

(52) U.S. Cl.
CPC ........ *H01L 23/49541* (2013.01); *H01L 25/07* (2013.01); *H01L 25/115* (2013.01); *H01L 25/18* (2013.01); *H02K 5/225* (2013.01); *H02K 11/00* (2013.01); *H02K 11/044* (2013.01); *H02K 11/046* (2013.01); *H02K 11/048* (2013.01); *H02K 11/33* (2016.01); *H02K 11/38* (2016.01); *H02M 7/003* (2013.01)

(58) Field of Classification Search
CPC ...... H02K 5/225; H02K 11/00; H02K 11/044; H02K 11/046; H02K 11/048; H02K 11/30; H02K 11/33; H02K 11/38; H02M 7/003
USPC .................................................. 310/68 D, 71
See application file for complete search history.

(56) References Cited

U.S. PATENT DOCUMENTS

| | | | |
|---|---|---|---|
| 5,838,544 A * | 11/1998 | Wei | ........................ H01L 25/112 361/704 |
| 6,285,100 B1 * | 9/2001 | Pflueger | ............... H02K 11/046 310/64 |
| 7,190,070 B2 | 3/2007 | Manz et al. | |
| 2010/0158723 A1 * | 6/2010 | Ihle | ..................... F04D 13/0666 417/423.7 |
| 2014/0145526 A1 * | 5/2014 | Shirakata | ................. H02K 5/10 310/52 |

FOREIGN PATENT DOCUMENTS

| EP | 1758165 A2 | 2/2007 |
|---|---|---|
| JP | 59-061090 A | 4/1984 |
| JP | 2013-188027 A | 9/2013 |
| JP | 2014-183615 A | 9/2014 |

OTHER PUBLICATIONS

International Search Report (ISR) relating to International Application No. PCT/JP2015/065584, dated Aug. 18, 2015.

European Patent Office, Supplementary European Search Report, relating to European Application No. 15894083.3, dated Oct. 4, 2018.

* cited by examiner

SEMICONDUCTOR DEVICE AND SEMICONDUCTOR DEVICE MOUNTING METHOD

CROSS REFERENCE TO PRIOR APPLICATION(S)

This application is a U.S. National Stage Patent Application of PCT International Patent Application Ser. No. PCT/JP2015/065584 (filed on May 29, 2015) under 35 U.S.C. § 371, which is hereby incorporated by reference herein in its entirety.

TECHNICAL FIELD

The present invention relates to a semiconductor device and a semiconductor device mounting method.

BACKGROUND ART

Conventionally, as semiconductor devices that control an electric motor or the like, there is one to be attached onto an object to be controlled.

For example, Patent Document 1 describes a configuration in which a plurality of semiconductor devices formed in a trapezoidal shape in plan view are individually attached onto an electric motor (base portion) formed in a cylindrical shape, and are arranged circular annularly.

CITATION LIST

Patent Document

[Patent Document 1] Japanese Patent Application Laid-Open Publication No. 2013-188027

SUMMARY OF THE INVENTION

Problems to be Solved by the Invention

Incidentally, in the configuration of Patent Document 1, when the plurality of semiconductor devices are individually screwed to the base portion, the number of screws for attaching the plurality of semiconductor devices onto the base portion increases. For this reason, the number of work steps for attaching the semiconductor devices onto the base portion increases, thereby resulting in an increase in cost.

An object of one aspect of the present invention is to provide a semiconductor device and a semiconductor device mounting method capable of attaching two semiconductor devices onto a base portion with a small number of screws so as to achieve a reduction in cost.

Means for Solving the Problems

A semiconductor device according to one aspect of the present invention includes a device main body that is semi-annular, the device main body having an inner circumferential surface formed arcuate in plan view and an outer circumferential surface formed arcuate in plan view. Cutout portions are formed on a first end surface, on one end side, in a circumferential direction, of the device main body and a second end surface, on an other end side, in the circumferential direction, of the device main body. The cutout portions are used for inserting screws for fixing the device main body to a base portion.

Effects of the Invention

According to one aspect of the present invention, in a state where two semiconductor devices are arranged such that device main bodies thereof form an annular shape, it is possible to insert a common screw into mutually-facing cutout portions of the two device main bodies. Thereby, it is possible to fix the two semiconductor devices to the base portion with the common screw. In other words, it is possible to reduce the number of screws for fixing the two semiconductor devices to the base portion. Therefore, it is possible to reduce the number of work steps for attaching the two semiconductor devices onto the base portion and to achieve a reduction in cost.

Additionally, since the common screw can be inserted into the mutually-facing cutout portions of the two device main bodies in the state where the two semiconductor devices are arranged as described above, the two semiconductor devices can also be positioned mutually with reference to the common screw.

MODE FOR CARRYING OUT THE INVENTION

[First Embodiment]

Hereinafter, a first embodiment of the present invention will be described with reference to FIGS. 1 to 3.

A semiconductor device 10 according to the present embodiment constitutes a control circuit of an electric motor 1 to be used in an electric power steering apparatus or the like of a vehicle. The use and function of this semiconductor device 10 are merely examples, and the use and function of the semiconductor device 10 are not limited to thereto.

Figure 1:
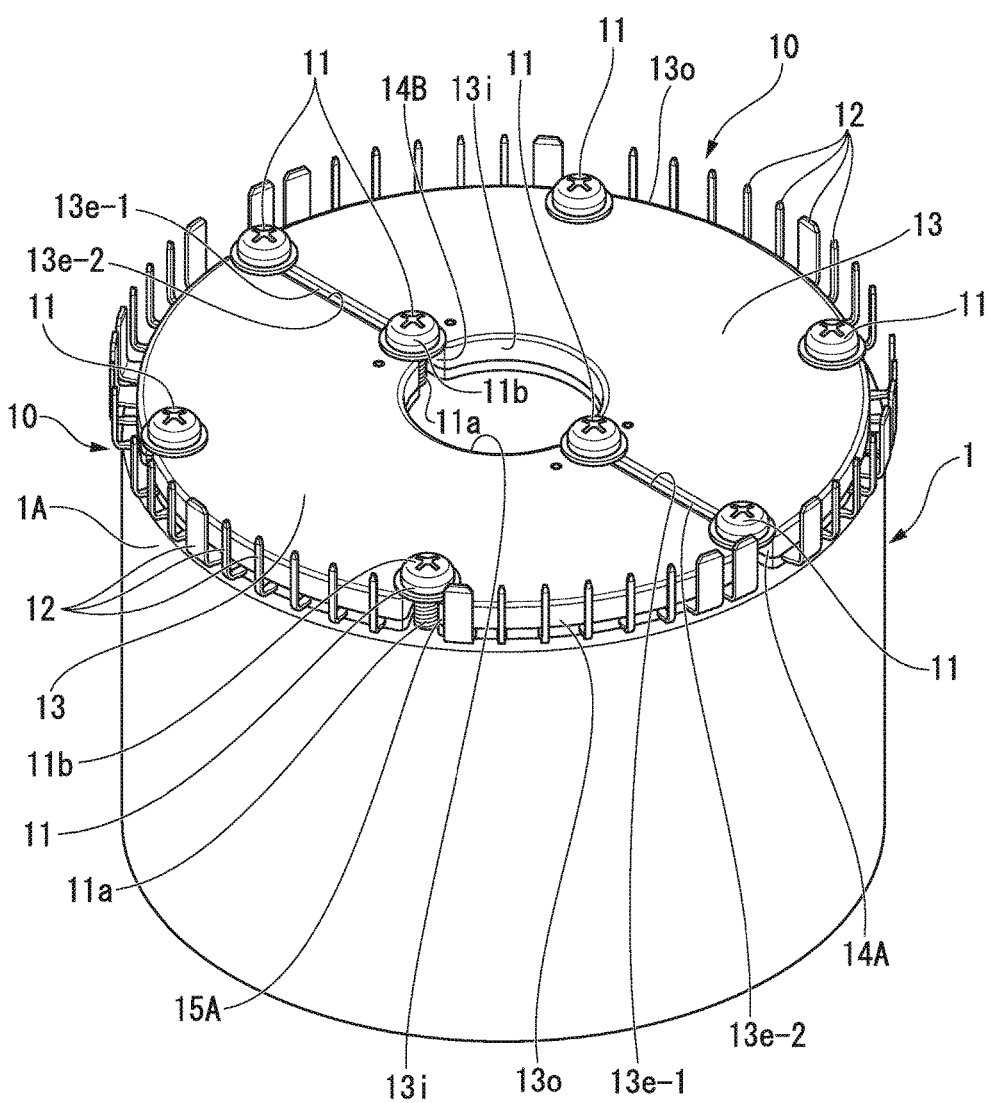
FIG. 1 is a perspective view of an electric motor employing a semiconductor device according to a first embodiment of the present invention.
Figure 2:
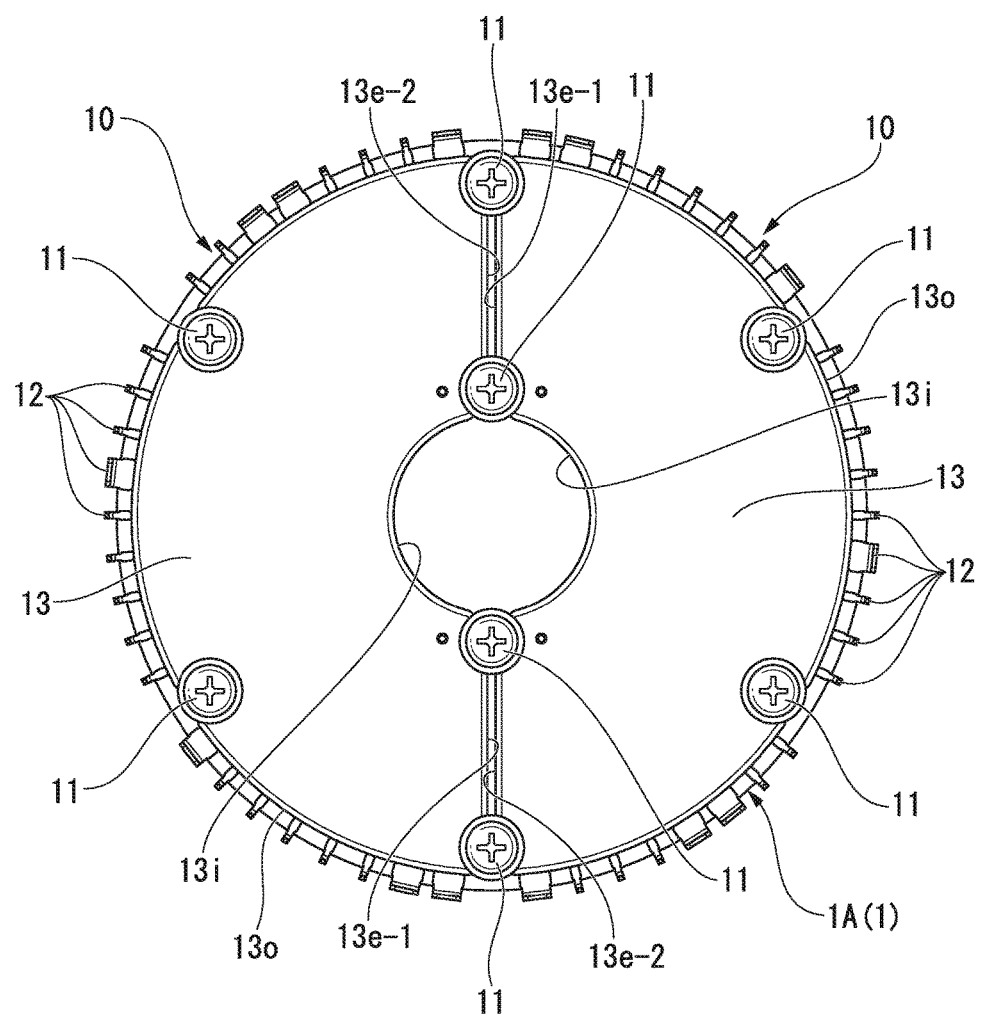
FIG. 2 is a plan view of the electric motor employing the semiconductor device according to the first embodiment of the present invention.

As shown in FIGS. 1 and 2, two semiconductor devices 10 having substantially the same shape are used in pairs. This pair of semiconductor devices 10 is fastened by a plurality of screws 11 to a base portion 1A provided on one end side, in an axial direction, of the substantially-cylindrical electric motor 1. In the present embodiment, each semiconductor device 10 constitutes a similar control circuit. For example, the control circuit of one of the semiconductor devices 10 is used as a main control circuit to be used at the normal time, while the other one of the semiconductor devices 10 is used as a backup control circuit to be used when inconvenience occurs in the control circuit of the one semiconductor device 10.

Here, for convenience of description, a side, in the axial direction, of the electric motor 1 onto which the semiconductor device 10 is attached will be referred to as an upper side, and the same side, in the axial direction, of the semiconductor device 10 is 10 also referred to as the upper side.

The semiconductor device 10 includes a device main body 13 and a plurality of connection terminals 12.

The device main body 13 is formed semi-circular annular (semi-annular) in plan view. Additionally, the device main body 13 is formed in a plate shape with a predetermined thickness. The device main body 13 is constituted by sealing with a sealing material such as mold resin, a semiconductor element and a circuit board (both not shown) which constitute the control circuit of the electric motor 1.

The plurality of connection terminals 12 are attached onto an outer edge portion (outer circumferential surface 13o) of the device main body 13 and are arranged at intervals in the circumferential direction of the device main body 13. The connection terminals 12 are made of a conductive material such as metal, and connect the semiconductor element and the circuit board in the device main body 13 to another external apparatus, a power source, or the like. Each connection terminal 12 is a lead that protrudes radially outward from the device main body 13 and thereafter bends in an L-shape toward the upper side. The L-shaped bent portion of each connection terminal 12 and a tip portion protruding upward from the bent portion are exposed to the outside on the radially outward of the device main body 13.

In the present embodiment, an inner circumferential surface 13i and the outer circumferential surface 13o of the device main body 13 are formed circular arcuate (arcuate) and concentric to each other. Here, in the present specification, a circumferential direction of the semiconductor device 10 means a direction along the arc of the semicircle drawn by the device main body 13 in plan view. Additionally, the inner circumferential surface 13i of the device main body 13 means a surface extending along the circumferential direction, positioned on the radially inward side of the device main body 13 in plan view. Further, the outer circumferential surface 13o of the device main body 13 means a surface extending along the circumferential direction, positioned on the radially outward side of the device main body 13 in plan view.

The device main body 13 has a first end surface 13e-1 on one end side in the circumferential direction and a second end surface 13e-2 on the other end side in the circumferential direction. The inner circumferential surface 13i and an outer circumferential surface 13o of the device main body 13 are connected to each other by the first end surface 13e-1 and the second end surface 13e-2 at the respective end portions, in the circumferential direction, of the device main body 13.

Figure 3:
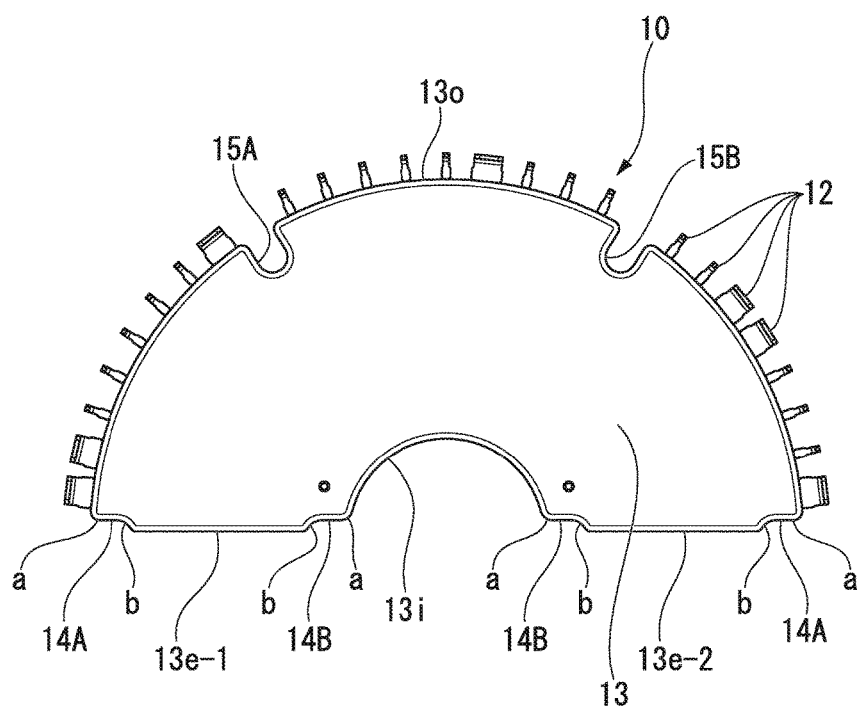
FIG. 3 is a plan view of the semiconductor device according to the first embodiment of the present invention.

As shown in FIG. 3, a first cutout portion 14A (cutout portion) is formed in the vicinity of each radially-outward corner portion of the first end surface 13e-1 and the second end surface 13e-2, adjacent to the outer circumferential surface 13o, of the device main body 13. The first cutout portion 14A has a straight portion a parallel to the first end surface 13e-1 and the second end surface 13e-2, and a curved portion b curved arcuately from the radially-inward end portion of the straight portion a toward the first end surface 13e-1 and the second end surface 13e-2.

Additionally, a second cutout portion 14B (cutout portion) is formed in the vicinity of each radially-inward corner portion of the first end surface 13e-1 and the second end surface 13e-2, adjacent to the inner circumferential surface 13i, of the device main body 13. Similarly to the first cutout portion 14A, the second cutout portion 14B has a straight portion a parallel to the first end surface 13e-1 and the second end surface 13e-2, and a curved portion b curved arcuately from the radially-outward end portion of the straight portion a toward the first end surface 13e-1 and the second end surface 13e-2.

As shown in FIG. 1, when the semiconductor device 10 is attached onto the base portion 1A of the electric motor 1, axis portions 11a of fastening screws 11 are inserted respectively into the first cutout portion 14A and the second cutout portion 14B of the device main body 13. The axis portions 11a of the screws 11 are tightened to the base portion 1A by a predetermined amount or more, so that the head portions 11b of the screws 11 push, from the upper side, the edge portions of the first cutout portion 14A and the second cutout portion 14B of the device main body 13.

Here, the first cutout portion 14A formed on the first end surface 13e-1 of the device main body 13 and the first cutout portion 14A formed on the second end surface 13e-2 thereof are arranged at positions equidistant from a center of curvature (center of arc) of the inner circumferential surface 13i and the outer circumferential surface 13o of the device main body 13. Similarly, the second cutout portion 14B formed on the first end surface 13e-1 of the device main body 13 and the second cutout portion 14B formed on the second end surface 13e-2 thereof are arranged at positions equidistant from the center of curvature (center of arc) of the inner circumferential surface 13i and the outer circumferential surface 13o of the device main body 13.

Additionally, as shown in FIG. 3, a plurality of (two in the illustrated example) outer circumferential cutout portions 15A and 15B are formed on the outer circumferential surface 13o of the device main body 13 so as to be spaced from each other in the circumferential direction. The axis portions 11a of the screws 11 for fixing the device main body 13 to the base portion 1A are inserted into the respective outer circumferential cutout portions 15A and 15B (see FIG. 1). The outer circumferential cutout portions 15A and 15B are formed recessed in a substantially U-shape radially inward from the outer circumferential surface 13o of the device main body 13. In the outer circumferential surface 13o of the device main body 13, a distance from the corner portion of the first end surface 13e-1 to the one outer circumferential cutout portion 15A and a distance from the corner portion of the second end surface 13e-2 to the outer circumferential cutout portion 15B are equal to each other.

A pair of semiconductor devices 10 is attached onto the base portion 1A of the electric motor 1 as follows.

First, the two semiconductor devices 10 are arranged circular annularly on the base portion 1A of the electric motor 1 in a state where the first end surface 13e-1 of the device main body 13 of one semiconductor device 10 faces the second end surface 13e-2 of the device main body 13 of the other semiconductor device 10, and the second end surface 13e-2 of the device main body 13 of the one semiconductor device 10 faces the first end surface 13e-1 of the device main body 13 of the other semiconductor device 10. At this time, the first cutout portions 14A of the two semiconductor devices 10 face each other, and the second cutout portions 14B thereof face each other. Additionally, at this time, each semiconductor device 10 is arranged such that the first cutout portions 14A, the second cutout portions 14B, and the outer circumferential cutout portions 15A and 15B are positioned above the corresponding screw holes (not shown) on the base portion 1A.

Here, in the case of the present embodiment, the outer diameter of the circular annular portion formed by the two semiconductor devices 10 may be, for example, the same as the outer diameter of the electric motor 1, or equal to or smaller than the outer diameter of the electric motor 1.

Next, the axis portions 11a of the screws 11 are inserted between the first cutout portions 14A of the two semiconductor devices 10 and between the second cutout portions 14B thereof, and the axis portion 11a of each screw 11 is tightened into a corresponding screw hole on the base portion 1A. Thus, the edge portion of the first cutout portion 14A and the edge portion of the second cutout portion 14B of the two respective semiconductor devices 10 are pressed against the base portion 1A and fixed by the common screw 11.

Additionally, before and after this, the axis portions 11a of the screws 11 are inserted into the outer circumferential cutout portions 15A and 15B of the respective semiconductor devices 10, and the axis portion 11a of each screw 11 is tightened into the corresponding screw hole on the base portion 1A. Thus, the edge portions of the outer circumferential cutout portions 15A and 15B of the two respective semiconductor devices 10 are pressed against the base portion 1A and fixed by the screws 11.

As a result, the two semiconductor devices 10 are fixed to the base portion 1A by the four screws 11 arranged between the two semiconductor devices 10, and the total of four screws 11 arranged on the respective outer circumferential surfaces 13o.

As described above, according to the semiconductor device 10 of the present embodiment, the first cutout portion 14A and the second cutout portion 14B are formed respectively on the first end surface 13e-1 and the second end surface 13e-2 of the device main body 13. For this reason, in the state where the device main bodies 13 of the pair of semiconductor devices 10 are arranged so as to form a circular annular shape as a whole, the common screws 11 can be inserted between the mutually-facing first cutout portions 14A of the device main bodies 13 of the two semiconductor devices 10, and between the mutually-facing second cutout portions 14B thereof, respectively. Therefore, when the semiconductor device 10 according to the present embodiment is adopted, it is possible to reduce the number of components when the two semiconductor devices 10 are attached onto the base portion 1A and to reduce the number of attaching work steps. As a result, the manufacturing cost can be reduced.

Additionally, in the case of the semiconductor device 10 according to the present embodiment, in the state where the device main bodies 13 of the two semiconductor devices 10 are arranged so as to form a circular annular shape, it is possible to insert the common screws 11 between the mutually facing cutout portions (between the first cutout portions 14A and between the second cutout portions 14B). Therefore, it is also possible to mutually position the two semiconductor devices 10 with reference to the common screws fixed to the base portion 1A. Here, the first cutout portion 14A and the second cutout portion 14B, mainly the curved portions b thereof, contact the axis portions 11a of the screws 11.

Further, according to the semiconductor device 10 of the present embodiment, the two first cutout portions 14A, as well as the two second cutout portions 14B, which are formed on the first end surface 13e-1 and the second end surface 13e-2, are arranged so as to be equidistant from the center of curvature of the device main body 13. Therefore, the two semiconductor devices 10 having the same shape can be attached onto the base portion 1A using the common screws 11.

Moreover, in the case of the semiconductor device 10 according to the present embodiment, the respective cutout portions (the first cutout portion 14A, the second cutout portion 14B) formed on the first end surface 13e-1 and the second end surface 13e-2 are formed at the portion adjacent to the outer circumferential surface 13o of the device main body 13 and at the portion adjacent to the inner circumferential surface 13i thereof. For this reason, the portions fixed by the screws 11 are unlikely to press space for mounting components, such as semiconductor elements and circuit boards, onto the device main body 13. Therefore, by adopting this structure, it is possible to increase the degree of freedom of arrangement design of components in the device main body 13.

Here, in the present embodiment, the cutout portions are provided at the portions of the first end surface 13e-1 and the second end surface 13e-2, adjacent to the outer circumferential surface 13o, of the device main body 13 and at the portions of the first end surface 13e-1 and the second end surface 13e-2, adjacent to the inner circumferential surface 13i, of the device main body 13. However, the cutout portions may be provided only at any one of the portions adjacent to the outer circumferential surface 13o and the portions adjacent to the inner circumferential surface 13i. Here, as in the present embodiment where the cutout portions are provided both at the portions of the first end surface 13e-1 and the second end surface 13e-2, adjacent to the outer circumferential surface 13o and at the portions of the first end surface 13e-1 and the second end surface 13e-2, adjacent to the inner circumferential surface 13i, the fastening balance of the device main body 13 becomes favorable in the radial direction.

Furthermore, in the semiconductor device 10 according to the present embodiment, the outer circumferential cutout portions 15A and 15B are provided on the outer circumferential surface 13o of the device main body 13, and the axis portions 11a of the screws 11 are inserted into these outer circumferential cutout portions 15A and 15B, so that the outer circumferential edge portion of the device main body 13 is fastened to the base portion 1A by the screws 11. Therefore, when the device main bodies 13 of the two semiconductor devices 10 are attached onto the base portion 1A so as to face each other, it is possible to regulate displacement in a direction away from the first end surface 13e-1 and the second end surface 13e-2 of the device main bodies 13, and lifting from the base portion 1A, and to increase the fixing balance of the device main bodies 13.

Additionally, in the present embodiment, the device main body 13 of the semiconductor device 10 is formed semicircular annular, and the two semiconductor devices 10 are attached onto the base portion 1A of the cylindrical electric motor 1 such that the two semiconductor devices 10 form a circular annular shape. Therefore, in the state where the two semiconductor devices 10 are attached onto the electric motor 1, the shape of the entire module including the both can be made a simple cylindrical shape. Therefore, by adopting this configuration, it is possible to easily assemble the module to a predetermined portion of an apparatus using the electric motor 1.

[Second Embodiment]

Next, a second embodiment of the present invention will be described with reference to FIG. 4 to FIG. 6, focusing on differences from the first embodiment. Here, configurations common to the first embodiment are appended with the same reference numerals, and description thereof will be omitted. Additionally, in FIG. 4, the connection terminal 12 (see FIGS. 1 to 3) is omitted.

Figure 4:
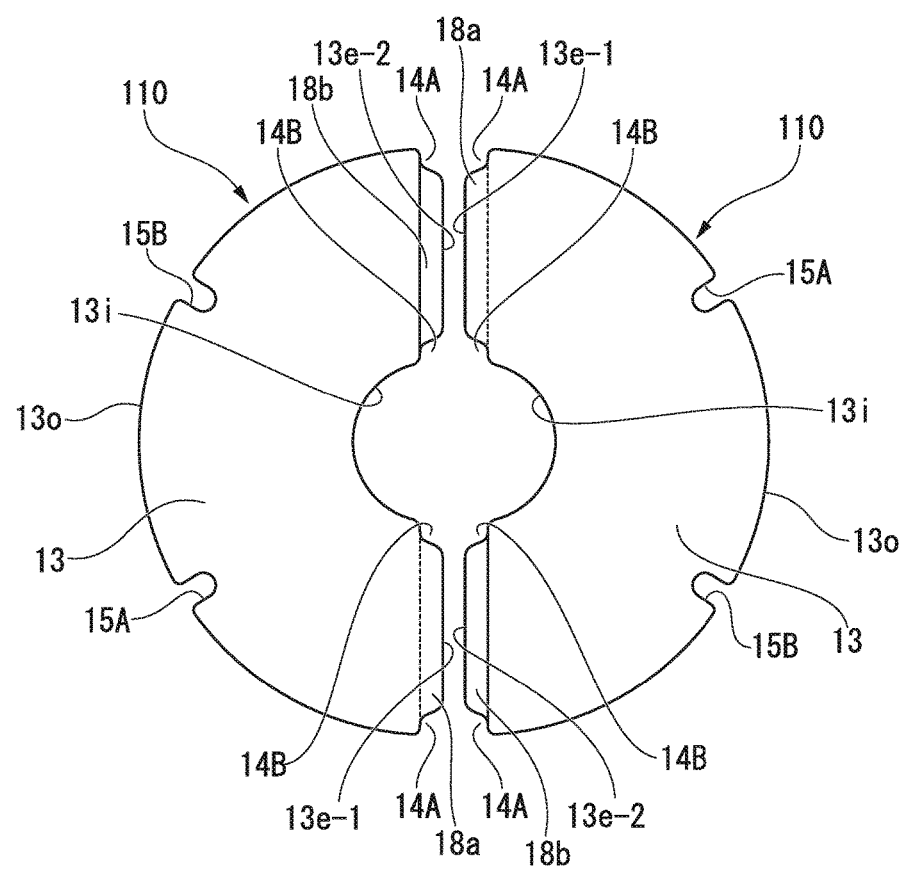
FIG. 4 is a plan view of two semiconductor devices according to a second embodiment of the present invention.
Figure 5:
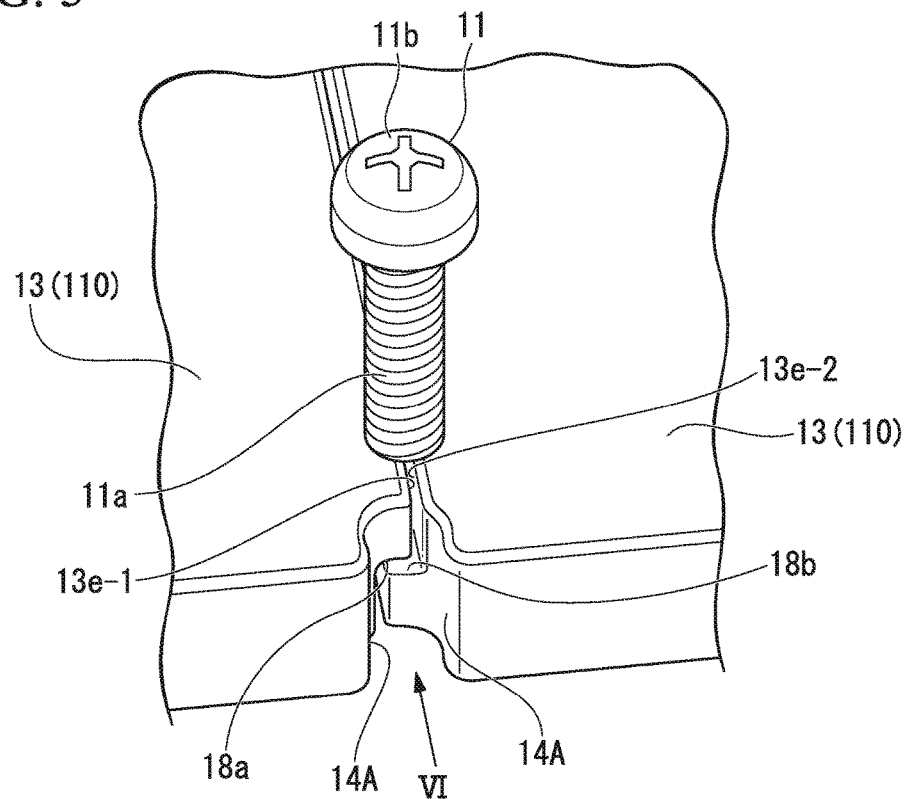
FIG. 5 is a perspective view showing part of the two semiconductor devices according to the second embodiment of the present invention.
Figure 6:
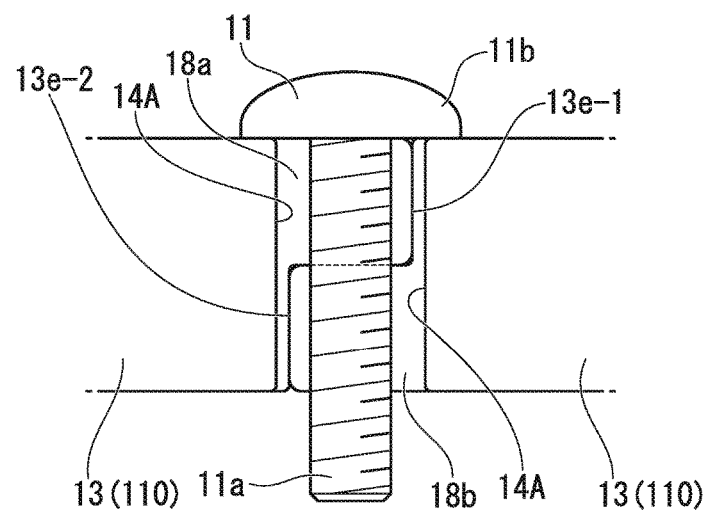
FIG. 6 is a view of a screwing portion of the two semiconductor devices according to the second embodiment of the present invention, as seen from a direction of an arrow VI shown in FIG. 5.

As shown in FIGS. 4 to 6, in a semiconductor device 110 according to the present embodiment, as in the first embodiment, the device main bodies 13 are formed semicircular annular in plan view, the first cutout portion 14A and the second cutout portion 14B are formed on the first end surface 13e-1 and the second end surface 13e-2 of each device main body 13, and the outer circumferential cutout portions 15A and 15B are formed on the outer circumferential surface 13o. Here, on the first end surface 13e-1 and the second end surface 13e-2, a first concavo-convex engaging portion 18a and a second concavo-convex engaging portion 18b are provided to be mutually engaged when the device main bodies 13 of the two semiconductor devices 110 are arranged to face each other.

The first concavo-convex engaging portion 18a provided on the first end surface 13e-1 is formed in such a shape that an upper half portion in the thickness direction protrudes in the circumferential direction with respect to a lower half portion. The first concavo-convex engaging portion 18a is not formed at portions of the first end surface 13e-1 where the first cutout portion 14A and the second cutout portion 14B are formed.

Additionally, the second concavo-convex engaging portion 18b provided on the second end surface 13e-2 is formed in such a shape that a lower half portion in the thickness direction protrudes in the circumferential direction with respect to an upper half portion. The second concavo-convex engaging portion 18b is not formed at portions of the second end surface 13e-2 where the first cutout portion 14A and the second cutout portion 14B are formed.

When the device main bodies 13 of the two semiconductor devices 110 are arranged to face each other, the upper half portion of the first concavo-convex engaging portion 18a on the first end surface 13e-1 of the device main body 13 of one semiconductor device 110 overlaps, in the thickness direction (vertical direction), the lower half portion of the second concavo-convex engaging portion 18b on the second end surface 13e-2 of the device main body 13 of the other semiconductor device 110.

According to the semiconductor device 110 of the present embodiment, the basic configuration is the same as that of the first embodiment, and therefore the same effects as those of the first embodiment are achieved.

Additionally, according to the semiconductor device 110 of the present embodiment, the first concavo-convex engaging portion 18a is provided on the first end surface 13e-1, and the second concavo-convex engaging portion 18b is provided on the second end surface 13e-2. Therefore, when the device main bodies 13 of the two semiconductor devices 110 are arranged to face each other, the first concavo-convex engaging portion 18a and the second concavo-convex engaging portion 18b of the two semiconductor devices 110 can be mutually engaged. Thereby, it is possible to prevent displacement between one semiconductor device 110 and the other semiconductor device 110. Particularly, in the present embodiment, since the upper half portion of the first concavo-convex engaging portion 18a and the lower half portion of the second concavo-convex engaging portion 18b overlap in the thickness direction, it is possible to prevent displacement between, in the thickness direction of, the two semiconductor devices 110. Therefore, when the semiconductor device 110 according to the present embodiment is adopted, it is possible to easily and accurately attach the two semiconductor devices 110 onto the base portion 1A.

[Third Embodiment]

Next, a third embodiment of the present invention will be described with reference to FIG. 7, focusing on differences from the first and second embodiments. Here, configurations common to the first and second embodiments are appended with the same reference numerals, and description thereof will be omitted. Additionally, in FIG. 7, the connection terminal 12 (see FIGS. 1 to 3) is omitted.

Figure 7:
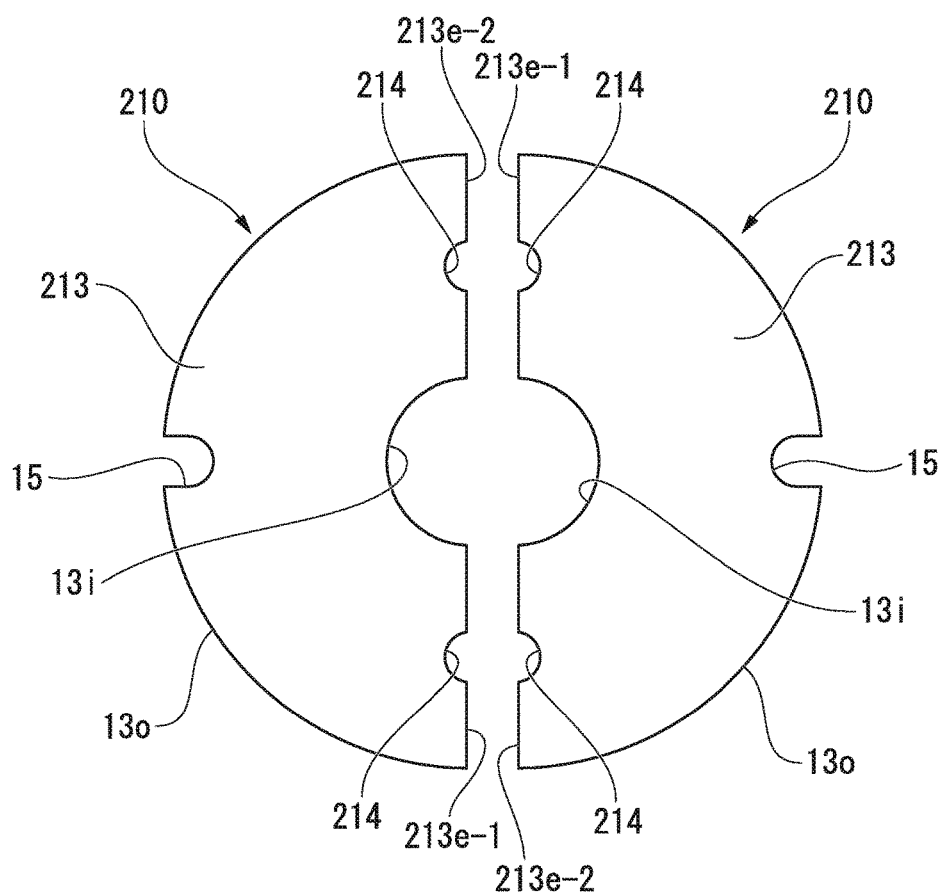
FIG. 7 is a plan view of two semiconductor devices according to a third embodiment of the present invention.

As shown in FIG. 7, in a semiconductor device 210 according to the present embodiment, as in the first and second embodiments, device main bodies 213 are formed semicircular annular in plan view, but one cutout portion 214 is formed on each of a first end surface 213e-1 and a second end surface 213e-2 of each device main body 213. The cutout portion 214 is formed semicircular in plan view on the radial center of each of the first end surface 213e-1 and the second end surface 213e-2. When the two device main bodies 213 are attached onto the base portion so as to face each other, so that the device main bodies 213 of the two semiconductor devices 210 form a circular annular shape as a whole, as in the first embodiment, the two cutout portions 214 of one semiconductor device 210 and the other semiconductor device 210 may be made to face each other so that an axis portion of a fastening screw is inserted between the mutually-facing cutout portions 214.

Additionally, one outer circumferential cutout portion 15 is formed at the center position, in the circumferential direction, of the outer circumferential surface 13o of the device main body 213. The outer circumferential cutout portion 15 is formed in a U-shape recessed radially inward. An axis portion of a fastening screw is inserted into the outer circumferential cutout portion 15.

According to the semiconductor device 210 of the present embodiment, the basic configuration is the same as that of the first embodiment, and therefore the same effects as those of the first embodiment are achieved.

Additionally, according to the semiconductor device 210 of the present embodiment, the cutout portion 214 is provided at the center of each of the first end surface 213e-1 and the second end surface 213e-2 of the device main body 213, and one outer circumferential cutout portion 15 is provided at the center of the outer circumferential surface 13o. Therefore, when the two semiconductor devices 210 are attached onto the base portion so as to face each other, the two semiconductor devices 210 can be fastened only by a total of four screws. Therefore, by using the semiconductor device 210 according to the present embodiment, it is possible to reduce the number of components and the number of attaching work steps, and to further achieve a reduction in manufacturing cost.

[Fourth Embodiment]

Next, a fourth embodiment of the present invention will be described with reference to FIGS. 8 and 9, focusing on differences from the third embodiment. Here, configurations common to the third embodiment are appended with the same reference numerals, and description thereof will be omitted.

Figure 8:
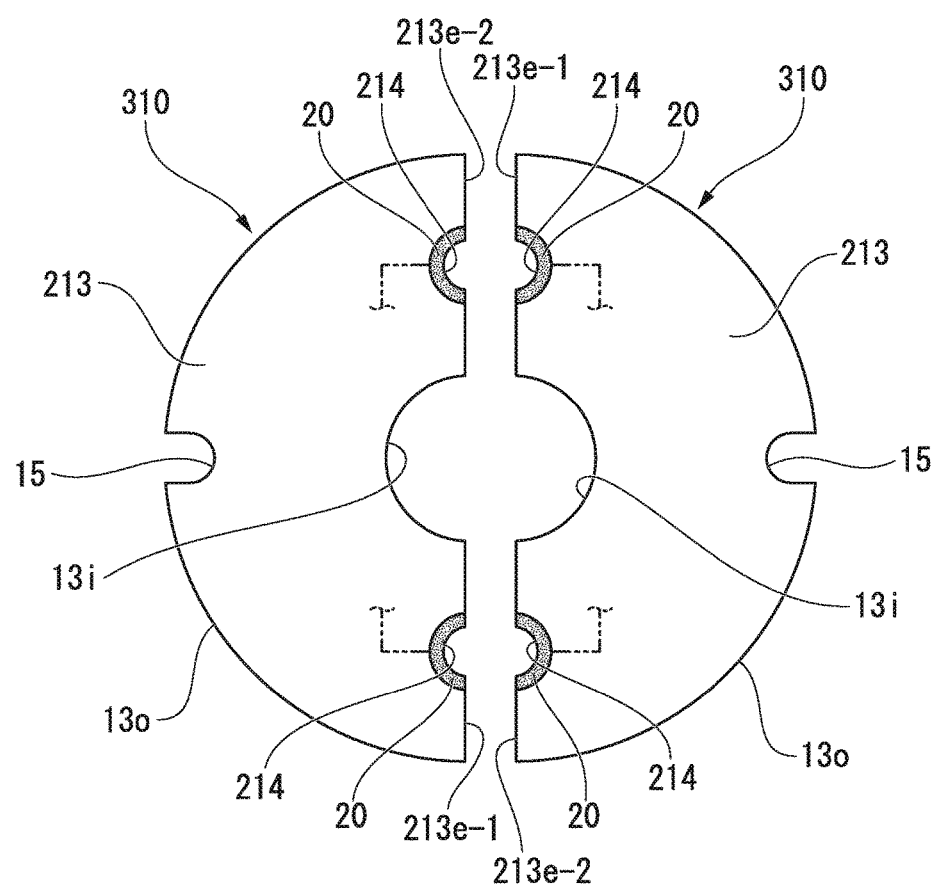
FIG. 8 is a plan view of two semiconductor devices according to a fourth embodiment of the present invention.
Figure 9:
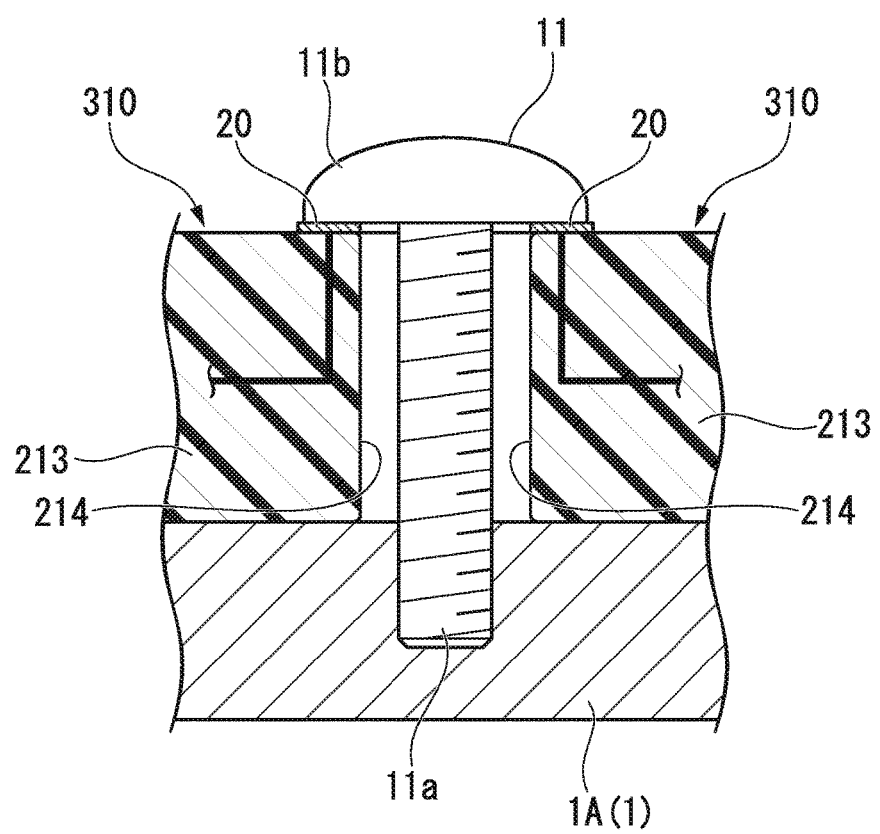
FIG. 9 is a cross-sectional view of a screwing portion of the two semiconductor devices according to the fourth embodiment of the present invention.

As shown in FIGS. 8 and 9, a semiconductor device 310 according to the present embodiment has the same basic structure as that of the third embodiment. However, ground conductors 20 are provided on circumferential edges, on the upper surface sides, of the cutout portions 214 formed on the first end surface 213e-1 and the second end surface 213e-2 of the upper surface of the device main body 213. The ground conductors 20 are connected to, for example, a low voltage portion of the control circuit in the semiconductor device 310.

When the two semiconductor devices 310 are arranged circular-annularly and attached onto the base portion 1A, as in the third embodiment, the two semiconductor devices 310 are fastened and fixed to the base portion 1A by inserting the axis portion 11a of the screw 11 between the mutually-facing cutout portions 214 of the two semiconductor devices 310 and tightening the screw 11. In the case of the present embodiment, the screw 11 is made of a conductive metal. When the screw 11 is tightened as described above, a head portion 11b of the screw 11 contacts the ground conductor 20 on the circumferential edge of the cutout portion 214, while the axis portion 11a of the screw 11 is tightened to the metal portion of the base portion. As a result, the control circuit in the semiconductor device 310 is grounded to the base portion 1A.

The semiconductor device 310 according to the present embodiment can obtain the same effects as those of the third embodiment, and the internal circuit can easily be grounded using the screw 11. The configuration of the semiconductor device 310 according to the fourth embodiment described here is applicable to the semiconductor devices 10 and 110 according to the above-described first and second embodiments.

Although the details of the present invention have been described above, the present invention is not limited to the above-described embodiments, and various modifications can be made without departing from the spirit of the present invention.

For example, in each of the above-described embodiments, although the outer circumferential surface and the inner circumferential surface of the device main body of the semiconductor device are formed circular arcuate, any one or both of the outer circumferential surface and the inner circumferential surface of the device main body may be a polygonal shape or an elliptical shape.

Additionally, in each of the above-described embodiments, the cutout portion formed on the first end surface of the device main body and the cutout portion formed on the second end surface thereof are arranged at the positions equidistant from the center of the arc of the device main body. If two device main bodies plane-symmetrical to each other in plan view are used, however, the positional relationship between the cutout portion formed at the first end surface and the cutout portion formed at the second end surface is arbitrary.

Further, in each of the above-described embodiments, the device main body is formed so that the inner circumferential surface and the outer circumferential surface are concentric to each other in plan view. In the case where two device main bodies plane-symmetrical to each other in plan view are used, however, the inner circumferential surface and the outer circumferential surface of the device main body may be eccentric to each other.

DESCRIPTION OF REFERENCE NUMERALS 1A base portion
10, 110, 210, 310 semiconductor device
11 screw
13 device main body
13e-1, 213e-1 first end surface
13e-2, 213e-2 second end surface
14A first cutout portion (cutout portion)
14B second cutout portion (cutout portion)
15 outer circumferential cutout portion
18a first concavo-convex engaging portion (concavo-convex engaging portion)
18b second concavo-convex engaging portion (concavo-convex engaging portion)
20 ground conductor
214 cutout portion

The invention claimed is:

1. A semiconductor device comprising:
a device main body that is semi-annular in plan view, the device main body having at least an inner circumferential side surface that is arcuate in plan view, an outer circumferential side surface that is arcuate in plan view, a first radial side surface, and a second radial side surface, the device main body having first to fourth corner portions, the first corner portion being defined by the first radial side surface and the outer circumferential side surface, the second corner portion being defined by the first radial side surface and the inner circumferential side surface, the third corner portion being defined by the second radial side surface and the outer circumferential side surface, and the fourth corner portion being defined by the second radial side surface and the inner circumferential side surface, wherein
at least one of the first and second corner portions and at least one of the third and fourth corner portions have cutout portions each having
a flat side surface extending radially from the outer or inner circumferential side surface, and
a curved side surface extending arcuately and connecting the flat side surface and the first or second radial side surface,
the flat side surface is parallel, and not aligned, with the first or second radial side surface, and
the semiconductor device is configured to be arranged adjacent to another same-structured semiconductor device to form an annular shape in plan view, so that the two mutually-facing same-shaped adjacent cutout portions of the two semiconductor devices form a single screw hole into which a screw is fitted to fix the device main bodies of the two semiconductor devices to a base portion of an electric motor.

2. The semiconductor device according to claim 1, wherein
the inner circumferential side surface and the outer circumferential side surface are concentric to each other in plan view,
the first and third corner portions, or the second and fourth corner portions, have the cutout portions, and
the cutout potions of the first and third corner portions, or the cutout portions of the second and fourth corner portions, are equidistant from a center of arc of the device main body.

3. The semiconductor device according to claim 1, wherein
all of the first to fourth corner positions have the cutout portions.

4. The semiconductor device according to claim 1, wherein
the outer circumferential side surface of the device main body has at least two cutout portions each having
two flat side surfaces extending radially inward from the outer circumferential side surface, and
a curved side surface extending arcuately and connecting the two flat side surfaces, the at least two cutout portions are circumferentially arranged at equal intervals, and the at least two cutout portions are used for inserting screws to fix the device main body to the base portion.

5. The semiconductor device according to claim 1, wherein the first radial side surface has a lower concave engaging portion and an upper convex engaging portion protruding circumferentially outward with respect to the lower concave engaging portion, and the second radial side surface has an upper concave engaging portion and a lower convex engaging portion protruding circumferentially outward with respect to the upper concave engaging portion.

6. The semiconductor device according to claim 1, wherein
each of the first radial side surface and the second radial side surface has a cutout portion in a radially center thereof,
the device main body further has a top surface and a bottom surface opposing the top surface, and
the semiconductor device further comprises:
a ground conductor on the top surface, adjacent along the cut out portion in plan view, and configured to be in contact with a screw with conductivity when the screw is inserted into the cutout portion.

7. A semiconductor device mounting method comprising:
preparing first and second semiconductor devices each comprising a device main body that is semi-annular in plan view, the device main body having at least an inner circumferential side surface that is arcuate in plan view, an outer circumferential side surface that is arcuate in plan view, a first radial side surface, and a second radial side surface, the device main body having first to fourth corner portions, the first corner portion being defined by the first radial side surface and the outer circumferential side surface, the second corner portion being defined by the first radial side surface and the inner circumferential side surface, the third corner portion being defined by the second radial side surface and the outer circumferential side surface, and the fourth corner portion being defined by the second radial side surface and the inner circumferential side surface, wherein
at least one of the first and second corner portions and at least one of the third and fourth corner portions have cutout portions each having
a flat side surface extending radially from the outer or inner circumferential side surface, and
a curved side surface extending arcuately and connecting the flat side surface and the first or second radial side surface, and
the flat side surface is parallel, and not aligned, with the first or second radial side surface;
adjacently arranging the first and second semiconductor devices to form an annular shape, in plan view, so that the two mutually-facing same-shaped adjacent cutout portions of the two semiconductor devices form a single screw hole; and
fitting by insertion a screw into the single screw hole to fix the device main bodies of the two semiconductor devices to a base portion of an electric motor.

8. The semiconductor device mounting method according to claim 7, wherein the first radial side surface has a lower concave engaging portion and an upper convex engaging portion protruding circumferentially outward with respect to the lower concave engaging portion, the second radial side surface has an upper concave engaging portion and a lower convex engaging portion protruding circumferentially outward with respect to the upper concave engaging portion, and adjacently arranging the two the two semiconductor devices further comprises: engaging the upper convex engaging portion of the first semiconductor device with the upper concave engaging portion of the second semiconductor device.

* * * * *